(12) United States Patent
Ye et al.

(10) Patent No.: US 12,575,139 B2
(45) Date of Patent: Mar. 10, 2026

(54) FET WITH MULTI-VALUE SWITCHING FUNCTION

(71) Applicant: Wenzhou University, Zhejiang (CN)

(72) Inventors: Hao Ye, Zhejiang (CN); Pengjun Wang, Zhejiang (CN); Bo Chen, Zhejiang (CN); Yijian Shi, Zhejiang (CN); Gang Li, Zhejiang (CN); Jialin Jiang, Zhejiang (CN); Haoran Fang, Zhejiang (CN); Xiaolong Yu, Zhejiang (CN)

(73) Assignee: Wenzhou University, Zhejiang (CN)

( * ) Notice: Subject to any disclaimer, the term of this patent is extended or adjusted under 35 U.S.C. 154(b) by 360 days.

(21) Appl. No.: 18/357,997

(22) Filed: Jul. 24, 2023

(65) Prior Publication Data

US 2024/0290873 A1    Aug. 29, 2024

(30) Foreign Application Priority Data

Feb. 27, 2023    (CN) .......................... 202310168924.1

(51) Int. Cl.
H10D 48/32 (2025.01)
H10D 48/00 (2025.01)
H10D 62/824 (2025.01)

(52) U.S. Cl.
CPC ......... H10D 48/366 (2025.01); H10D 48/383 (2025.01); H10D 62/824 (2025.01)

(58) Field of Classification Search
CPC .. H10D 48/366; H10D 48/383; H10D 62/824; H10D 12/021; H10D 12/211; H10D 62/113; H10D 62/151; H10D 62/235; H10D 30/60; H10D 62/85; H10D 64/514; H10D 64/517; Y02D 10/00
See application file for complete search history.

(56) References Cited

U.S. PATENT DOCUMENTS

| | | | |
|---|---|---|---|
| 8,222,680 B2 * | 7/2012 | Lin | H10D 30/0245 |
| | | | 257/315 |
| 2017/0179283 A1 * | 6/2017 | Pourghaderi | H10D 62/151 |
| 2017/0365641 A1 * | 12/2017 | Bedau | H10B 63/80 |

OTHER PUBLICATIONS

Yoo et al.; "Multi-valued logic system: new opportunities from emerging materials and devices"; Journal of Materials Chemistry C, 2021, 9, 4092 (Year: 2021).*
Shin; "Ultra-Low Power Ternary CMOS Platform for Physical Synthesis of Multi-Valued Logic and Memory Applications"; Doctoral Dissertation, Graduate School of UNIST, 2017 (Year: 2017).*

* cited by examiner

*Primary Examiner* — Syed I Gheyas
(74) *Attorney, Agent, or Firm* — JCIPRNET

(57) ABSTRACT
A FET with a multi-value switching function comprises a source region, a channel region, a drain region, a gate dielectric layer, a substrate layer, a gate-oxide inducer layer, a metal layer and a spacer layer. The channel region is an undoped channel region, the drain region is an undoped drain region. The metal layer comprises first to third metal blocks which are arranged at intervals from left to right, the distance between the first metal block and the second metal block is 12 nm, the distance between the second metal block and the third metal block is 10 nm, the first metal block is a main control gate of the FET, the second metal block and the third metal block are two inducer gates of the FET, and the spacer layer is used for isolating the first metal block from the second metal block and the third metal block.

6 Claims, 2 Drawing Sheets

FET WITH MULTI-VALUE SWITCHING FUNCTION

CROSS-REFERENCE TO RELATED APPLICATION

This application claims the priority benefit of China application serial no. 202310168924.1, filed on Feb. 27, 2023. The entirety of the above-mentioned patent application is hereby incorporated by reference herein and made a part of this specification.

BACKGROUND

Technical Field

The invention relates to field effect transistors (FETs), in particular to a FET with a multi-value switching function.

Description of Related Art

The multi-value logic technique makes it possible to transmit more information on a given data path and to store more information in the same storage space, thus being able to solve the problem of power consumption caused by a sharp increase of the information density in the aspect of circuit architecture. Compared with traditional binary Boolean logic, the ternary logic applied to integrated circuit design has many advantages, for example, since the expression capacity of the ternary logic is higher, a circuit system based on the ternary logic can reduce the number of transistors in a chip and can realize shorter and simpler interconnection lines. At present, ternary logic behaviors are realized commonly through the multi-threshold transistor technique; however, when the multi-threshold transistor technique is used for constructing a ternary logic circuit unit, an extra off-chip resistor or a $0.5V_{DD}$ voltage source is needed, and more transistors are required. In addition, ternary logic resistors may be realized by means of the negative differential resistance or trans-conductance of new semiconductor materials in the field, which has the problems of electrical characteristic hysteresis and non-full swing output. All these techniques realize ternary logic behaviors by introducing extra passive devices on the basis of transistors, and the problem caused by the introduction of passive devices counteracts the advantages of the ternary logic technique.

At present, on the basis of a traditional CMOS or GAA CMOS, a Ternary-CMOS (T-CMOS) is realized by heavily doping the substrate of the traditional CMOS or GAA CMOS. The T-CMOS introduces an inter-band tunneling conduction mechanism of carriers by means of a PN junction formed by high-concentration doping of a substrate/drain region, and a third output level is formed by means of a leakage current of the substrate of the T-CMOS. By using the T-CMOSs to construct a multi-value logic unit, an extra passive device is not needed, so the problem caused by the introduction of the passive device is avoided. However, when the T-CMOSs are used to construct a multi-value logic unit, a N-type T-CMOS should completely match a P-type T-CMOS in current characteristics, especially in an inter-band tunneling current. However, the inter-band tunneling current, serving as the leakage current, are extremely likely to be affected by doping fluctuations of the substrate and the drain voltage, which will lead to fluctuations of a T-CMOS threshold, making the current characteristics of the N-type T-CMOS mismatch the current characteristics of the P-type T-CMOS and the noise margin of a third output voltage degraded, and thus, the performance of the multi-value logic unit constructed through T-CMOSs is unstable.

In view of this, the invention provides a FET with a multi-value switching function, which is insensitive to doping fluctuations and process fluctuations and does not need an extra passive device.

SUMMARY

The technical issue to be settled by the invention is to provide a FET with a multi-value switching function, which, when used for constructing a multi-value logic unit, does not need to introduce an extra passive device, is insensitive to doping fluctuations and process fluctuations, and can improve the performance stability of the multi-value logic unit.

The technical solution adopted by the invention to settle the above technical issue is as follows: an FET with a multi-value switching function comprises a main structure, a gate dielectric layer and a substrate layer, wherein the main structure comprises a source region, a channel region and a drain region which are distributed on the substrate layer from left to right and connected in sequence, the channel region is an undoped channel region and is made from an InAs material, the drain region is an undoped drain region and is made from an InAlAs material, and the gate dielectric layer is stacked on the source region and extends to the top of the channel region. The FET further comprises a gate-oxide inducer layer, a metal layer and a spacer layer, the gate-oxide inducer layer is stacked on the drain region and extends to the top of the channel region to be connected to the gate dielectric layer, the metal layer comprises a first metal block, a second metal block and a third metal block which are arranged at intervals from left to right, the first metal block is stacked on the gate dielectric layer, the second metal block is stacked on the gate-oxide inducer layer, the third metal block is stacked on the gate-oxide inducer layer, the distance between the first metal block and the second metal block is 12 nm, the distance between the second metal block and the third metal block is 10 nm, the first metal block is a main control gate of the FET, the second metal block and the third metal block are used as two inducer gates of the FET, a gate voltage is accessed to the first metal block, the second metal block and the third metal block are used for generating a tunnel junction at a joint interface of the channel region and the drain region in one aspect and are used for realizing electrostatic doping of the channel region and the drain region under the induction of the gate-oxide inducer layer in another aspect, such that the channel region and the drain region do not need to be chemically doped, and the spacer layer is used for isolating the first metal block from the second metal block and the third metal block to prevent the second metal block and the third metal block against interference from the gate voltage accessed to the first metal block.

When the FET is a N-type FET, a gate work function of the first metal block is 5.57 eV, a gate work function of the second metal block is 4.60 eV, and a gate work function of the third metal block is 4.34 eV. When the FET is a P-type FET, a gate work function of the first metal block is 4.47 eV, a gate work function of the second metal block is 4.40 eV, and a gate work function of the third metal block is 5.90 eV.

The source region is made from NiAl alloy, the substrate layer is made from a sapphire material, the spacer layer is made from silicon nitride, the gate-oxide inducer layer is made from silicon dioxide, the gate dielectric layer is made from aluminum oxide, and the first metal block, the second metal block and the third metal block are made from polysilicon.

The source region, the channel region and the drain region are all rectangular structures, length directions of the source region, the channel region and the drain region are in the left-right direction, width directions of the source region, the channel region and the drain region are the front-back direction, thickness directions of the source region, the channel region and the drain region are the up-down direction, front surfaces of the source region, the channel region and the drain region are located at the same plane, back surfaces of the source region, the channel region and the drain region are located at the same plane, upper surfaces of the source region, the channel region and the drain region are located at the same plane, lower surfaces of the source region, the channel region and the drain region are located at the same plane, a right surface of the source region is fixedly connected and attached to a left surface of the channel region, and a right surface of the channel region is fixedly connected and attached to a left surface of the drain region. The substrate layer is a rectangular structure and is stacked below the source region, the channel region and the drain region, a front surface of the substrate layer is located in front of the plane where the front surface of the source region is located, a back surface of the substrate layer is located behind the plane where the back surface of the source region is located, a left surface of the substrate layer is located at the left of a plane where a left surface of the source region is located, a right surface of the substrate layer is located at the right of a plane where a right surface of the drain region is located, and an upper surface of the substrate layer is fixedly connected to the lower surfaces of the source region, the channel region and the drain region. The gate dielectric layer is a rectangular structure, a left surface of the gate dielectric layer is located at the same plane as the left surface of the resource region, a front surface of the gate dielectric layer is located at the same plane as the front surface of the source region, a back surface of the gate dielectric layer is located at the same plane as the back surface of the source region, a right surface of the gate dielectric layer is located between a plane where the left surface of the channel region is located and a plane where the right surface of the channel region is located, and a lower surface of the gate dielectric layer is fixedly connected to the upper surfaces of the source region and the channel region. The gate-oxide inducer layer is a rectangular structure, a front surface of the gate-oxide inducer layer is located at the same plane as the front surface of the gate dielectric layer, a back surface of the gate-oxide inducer layer is located at the same plane as the back surface of the gate dielectric layer, an upper surface of the gate-oxide inducer layer is located at the same plane as the upper surface of the gate dielectric layer, a lower surface of the gate-oxide inducer layer is located at the same plane as the lower surface of the gate dielectric layer, a right surface of the gate-oxide inducer layer is located at the same plane as the right surface of the drain region, a lower surface of the gate-oxide inducer layer is fixedly connected to the upper surfaces of the drain region and the channel region, and a left surface of the gate-oxide inducer layer is fixedly connected and attached to the right surface of the gate dielectric layer. The first metal block, the second metal block and the third metal block are all rectangular structures, a left surface of the first metal block is located at the same plane as the left surface of the gate dielectric layer, a right surface of the first metal block is located at the same plane as the right surface of the gate dielectric layer, a front surface of the first metal block is located at the same plane as the front surface of the gate dielectric layer, a back surface of the first metal block is located at the same plane as the back surface of the gate dielectric layer, a lower surface of the first metal block is fixedly connected to the upper surface of the gate dielectric layer, a front surface of the second metal block is located at the same plane as the front surface of the first metal block, a back surface of the second metal block is located at the same plane as the back surface of the first metal block, an upper surface of the second metal block is located at the same plane as the upper surface of the first metal block, a lower surface of the second metal block is located at the same plane as the lower surface of the first metal block and is fixedly connected to the upper surface of the gate-oxide inducer layer, a front surface of the third metal block is located at the same plane as the front surface of the first metal block, a back surface of the third metal block is located at the same plane as the back surface of the first metal block, an upper surface of the third metal block is located at the same plane as the upper surface of the first metal block, a lower surface of the third metal block is located at the same plane as the lower surface of the first metal block and is fixedly connected to the upper surface of the gate-oxide inducer layer, a left surface of the third metal block is located at the same plane as the left surface of the drain region, and a right surface of the third metal block is located at the same plane as the right surface of the drain region.

The spacer layer comprises a first spacer block, a second spacer block and a third spacer block which are formed integrally, wherein the second spacer block and the third spacer block are spaced from each other in the left-right direction, the second spacer block is located at the left of the third spacer block, the first spacer block is stacked on the second spacer block and the third spacer block, front surfaces of the first spacer block, the second spacer block and the third spacer block are located at the same plane, back surfaces of the first spacer block, the second spacer block and the third spacer block are located at the same plane, lower surfaces of the second spacer block and the third spacer block are located at the same plane, a left surface of the first spacer block is located at the left of a plane where a left surface of the second spacer block is located or is aligned with the left surface of the second spacer block in the up-down direction, a right surface of the first spacer block is located at the right of a plane where a right surface of the third spacer block is located or is aligned with the right surface of the third spacer block in the up-down direction, the second spacer block is embedded between the first metal block and the second metal block, the left surface of the second spacer block is attached to the right surface of the first metal block, a right surface of the second spacer block is attached to the left surface of the second metal block, a lower surface of the second spacer block is located at the same plane as the lower surface of the second metal block, an upper surface of the second spacer block is located at the same plane as the upper surface of the second metal block, a front surface of the second spacer block is located at the same plane as the front surface of the second metal block, a back surface of the second spacer block is located at the same plane as the back surface of the second metal block, the third spacer block is embedded between the second metal block and the third metal block, a left surface of the third spacer block is attached to the right surface of the second metal block, and the right surface of the third spacer block is attached to the left surface of the third metal block.

The source region has a length of 20 nm and a width of 500 nm, the channel region has a length of 50 nm and a width of 500 nm, and the drain region has a length of 20 nm and a width of 500 nm. The length of the gate dielectric layer in the left-right direction is 28 nm, the thickness of the gate dielectric layer in the up-down direction is 3 nm, and the distance between the plane where the right surface of the gate dielectric layer is located and the plane where the left surface of the channel region is located is 8 nm. The length of the gate-oxide inducer layer in the left-right direction is 62 nm, and the thickness of the gate-oxide inducer layer in the up-down direction is 3 nm. The length of the first metal block in the left-right direction is 28 nm, the thickness of the first metal block in the up-down direction is 5 nm, the lengths of the second metal block and the third metal block in the left-right direction are 20 nm, and the thicknesses of the second metal block and the third metal block in the up-down direction are 5 nm.

Compared with the prior art, the invention has the following advantages: intrinsic doping of the channel region and N+ electrostatic doping of the drain region can be realized through the second metal block, the third metal block and the gate-oxide inducer layer, so the channel region and the drain region of the FET with a multi-value switching function of the invention do not need to be doped with ion. The channel region is an undoped channel region, and the drain region is an undoped drain region, so the influence of fluctuations of ion doping of the channel region and the drain region of traditional devices on the inter-band tunneling current is reduced, the risk of current mismatching of the N-type device and the P-type device realized by the FET with a multi-value switching function of the invention is lowered, and the stability of a ternary logic unit is improved. Moreover, a ternary logic behavior can be realized without introducing any bias or passive device (resistor, inductor, capacitor or the like) to the second metal block and the third metal block, so no extra passive device is needed when a ternary logic unit (such as a ternary inverter) is constructed. The distance between the second metal block and the third metal block provides a sufficient tunneling distance for the N-type device and the P-type device realized by the FET with a multi-value switching function of the invention, such that the process limitation of the distance between the second metal block and the third metal block is overcome. In addition, the first metal block extends from the source region to the top of the channel region, and the size of the first metal block in the left-right direction is greater than the size of the source region in the left-right direction, so a turn-on current component which is large enough and far greater than the tunneling current can be obtained, thus guaranteeing the performance of products. Therefore, when the FET with a multi-value switching function is used for constructing a multi-value logic unit, no extra passive device needs to be introduced, and the FET is insensitive to doping fluctuations and process fluctuations, and can improve the stability of the multi-value logic unit.

DESCRIPTION OF THE EMBODIMENTS

The invention will be described in further detail below in conjunction with accompanying drawings.

Figure 1:
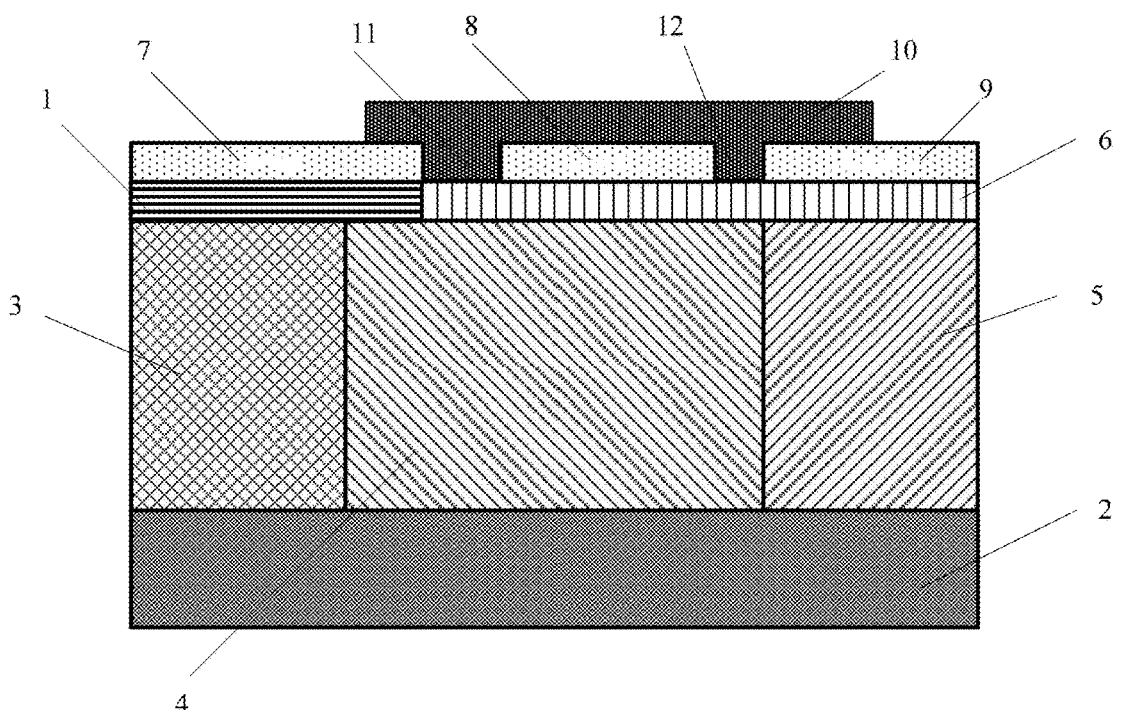
FIG. 1 is a main view of a FET with a multi-value switching function according to the invention.

Embodiment 1: As shown in FIG. 1, a FET with a multi-value switching function comprises a main structure, a gate dielectric layer 1 and a substrate layer 2, wherein the main structure comprises a source region 3, a channel region 4 and a drain region 5 which are distributed on the substrate layer 2 from left to right and connected in sequence, the channel region 4 is an undoped channel region 4 and is made from an InAs material, the drain region 5 is an undoped drain region 5 and is made from an InAlAs material, and the gate dielectric layer 1 is stacked on the source region 3 and extends to the top of the channel region 4. The FET further comprises a gate-oxide inducer layer 6, a metal layer and a spacer layer, the gate-oxide inducer layer 6 is stacked on the drain region 5 and extends to the top of the channel region 4 to be connected to the gate dielectric layer 1, the metal layer comprises a first metal block 7, a second metal block 8 and a third metal block 9 which are arranged at intervals from left to right, the first metal block 7 is stacked on the gate dielectric layer 1, the second metal block 8 is stacked on the gate-oxide inducer layer 6, the third metal block 9 is stacked on the gate-oxide inducer layer 6, the distance between the first metal block 7 and the second metal block 8 is 12 nm, the distance between the second metal block 8 and the third metal block 9 is 10 nm, the first metal block 7 is a main control gate of the FET, the second metal block 8 and the third metal block 9 are used as two inducer gates of the FET, a gate voltage is accessed to the first metal block 7, the second metal block 8 and the third metal block 9 are used for generating a tunnel junction at a joint interface of the channel region 4 and the drain region 5 in one aspect and are used for realizing electrostatic doping of the channel region 4 and the drain region 5 under the induction of the gate-oxide inducer layer 6 in another aspect, such that the channel region 4 and the drain region 5 do not need to be chemically doped, and the spacer layer is used for isolating the first metal block 7 from the second metal block 8 and the third metal block 9 to prevent the second metal block 8 and the third metal block 9 against interference from the gate voltage accessed to the first metal block 7.

In this embodiment, a gate work function of the first metal block 7 is 5.57 eV, a gate work function of the second metal block 8 is 4.60 eV, a gate work function of the third metal block 9 is 4.34 eV, and the FET is a N-type FET.

In this embodiment, the source region 3 is made from NiAl alloy, the substrate layer 2 is made from a sapphire material, the spacer layer is made from silicon nitride, the gate-oxide inducer layer 6 is made from silicon dioxide, the gate dielectric layer 1 is made from aluminum oxide, and the first metal block 7, the second metal block 8 and the third metal block 9 are made from polysilicon.

In this embodiment, the source region 3, the channel region 4 and the drain region 5 are all rectangular structures, length directions of the source region 3, the channel region 4 and the drain region 5 are in the left-right direction, width directions of the source region 3, the channel region 4 and the drain region 5 are the front-back direction, thickness directions of the source region 3, the channel region 4 and the drain region 5 are the up-down direction, front surfaces of the source region 3, the channel region 4 and the drain region 5 are located at the same plane, back surfaces of the source region 3, the channel region 4 and the drain region 5 are located at the same plane, upper surfaces of the source region 3, the channel region 4 and the drain region 5 are located at the same plane, lower surfaces of the source region 3, the channel region 4 and the drain region 5 are located at the same plane, a right surface of the source region 3 is fixedly connected and attached to a left surface of the channel region 4, and a right surface of the channel region 4 is fixedly connected and attached to a left surface of the drain region 5. The substrate layer 2 is a rectangular structure and is stacked below the source region 3, the channel region 4 and the drain region 5, a front surface of the substrate layer 2 is located in front of the plane where the front surface of the source region 3 is located, a back surface of the substrate layer 2 is located behind the plane where the back surface of the source region 3 is located, a left surface of the substrate layer 2 is located at the left of a plane where a left surface of the source region 3 is located, a right surface of the substrate layer 2 is located at the right of a plane where a right surface of the drain region 5 is located, and an upper surface of the substrate layer 2 is fixedly connected to the lower surfaces of the source region 3, the channel region 4 and the drain region 5. The gate dielectric layer 1 is a rectangular structure, a left surface of the gate dielectric layer 1 is located at the same plane as the left surface of the resource region 3, a front surface of the gate dielectric layer 1 is located at the same plane as the front surface of the source region 3, a back surface of the gate dielectric layer 1 is located at the same plane as the back surface of the source region 3, a right surface of the gate dielectric layer 1 is located between a plane where the left surface of the channel region 4 is located and a plane where the right surface of the channel region 4 is located, and a lower surface of the gate dielectric layer 1 is fixedly connected to the upper surfaces of the source region 3 and the channel region 4. The gate-oxide inducer layer 6 is a rectangular structure, a front surface of the gate-oxide inducer layer 6 is located at the same plane as the front surface of the gate dielectric layer 1, a back surface of the gate-oxide inducer layer 6 is located at the same plane as the back surface of the gate dielectric layer 1, an upper surface of the gate-oxide inducer layer 6 is located at the same plane as the upper surface of the gate dielectric layer 1, a lower surface of the gate-oxide inducer layer 6 is located at the same plane as the lower surface of the gate dielectric layer 1, a right surface of the gate-oxide inducer layer 6 is located at the same plane as the right surface of the drain region 5, a lower surface of the gate-oxide inducer layer 6 is fixedly connected to the upper surfaces of the drain region 5 and the channel region 4, and a left surface of the gate-oxide inducer layer 6 is fixedly connected and attached to the right surface of the gate dielectric layer 1. The first metal block 7, the second metal block 8 and the third metal block 9 are all rectangular structures, a left surface of the first metal block 7 is located at the same plane as the left surface of the gate dielectric layer 1, a right surface of the first metal block 7 is located at the same plane as the right surface of the gate dielectric layer 1, a front surface of the first metal block 7 is located at the same plane as the front surface of the gate dielectric layer 1, a back surface of the first metal block 7 is located at the same plane as the back surface of the gate dielectric layer 1, a lower surface of the first metal block 7 is fixedly connected to the upper surface of the gate dielectric layer 1, a front surface of the second metal block 8 is located at the same plane as the front surface of the first metal block 7, a back surface of the second metal block 8 is located at the same plane as the back surface of the first metal block 7, an upper surface of the second metal block 8 is located at the same plane as the upper surface of the first metal block 7, a lower surface of the second metal block 8 is located at the same plane as the lower surface of the first metal block 7 and is fixedly connected to the upper surface of the gate-oxide inducer layer 6, a front surface of the third metal block 9 is located at the same plane as the front surface of the first metal block 7, a back surface of the third metal block 9 is located at the same plane as the back surface of the first metal block 7, an upper surface of the third metal block 9 is located at the same plane as the upper surface of the first metal block 7, a lower surface of the third metal block 9 is located at the same plane as the lower surface of the first metal block 7 and is fixedly connected to the upper surface of the gate-oxide inducer layer 6, a left surface of the third metal block 9 is located at the same plane as the left surface of the drain region 5, and a right surface of the third metal block 9 is located at the same plane as the right surface of the drain region 5.

In this embodiment, the spacer layer comprises a first spacer block 10, a second spacer block 11 and a third spacer block 12 which are formed integrally, wherein the second spacer block 11 and the third spacer block 12 are spaced from each other in the left-right direction, the second spacer block 11 is located at the left of the third spacer block 12, the first spacer block 10 is stacked on the second spacer block 11 and the third spacer block 12, front surfaces of the first spacer block 10, the second spacer block 11 and the third spacer block 12 are located at the same plane, back surfaces of the first spacer block 10, the second spacer block 11 and the third spacer block 12 are located at the same plane, lower surfaces of the second spacer block 11 and the third spacer block 12 are located at the same plane, a left surface of the first spacer block 10 is located at the left of a plane where a left surface of the second spacer block 11 is located or is aligned with the left surface of the second spacer block 11 in the up-down direction, a right surface of the first spacer block 10 is located at the right of a plane where a right surface of the third spacer block 12 is located or is aligned with the right surface of the third spacer block 12 in the up-down direction, the second spacer block 11 is embedded between the first metal block 7 and the second metal block 8, the left surface of the second spacer block 11 is attached to the right surface of the first metal block 7, a right surface of the second spacer block 11 is attached to the left surface of the second metal block 8, a lower surface of the second spacer block 11 is located at the same plane as the lower surface of the second metal block 8, an upper surface of the second spacer block 11 is located at the same plane as the upper surface of the second metal block 8, a front surface of the second spacer block 11 is located at the same plane as the front surface of the second metal block 8, a back surface of the second spacer block 11 is located at the same plane as the back surface of the second metal block 8, the third spacer block 12 is embedded between the second metal block 8 and the third metal block 9, a left surface of the third spacer block 12 is attached to the right surface of the second metal block 8, and the right surface of the third spacer block 12 is attached to the left surface of the third metal block 9.

In this embodiment, the source region 3 has a length of 20 nm and a width of 500 nm, the channel region 4 has a length of 50 nm and a width of 500 nm, and the drain region 5 has a length of 20 nm and a width of 500 nm. The length of the gate dielectric layer 1 in the left-right direction is 28 nm, the thickness of the gate dielectric layer 1 in the up-down direction is 3 nm, and the distance between the plane where the right surface of the gate dielectric layer 1 is located and the plane where the left surface of the channel region 4 is located is 8 nm. The length of the gate-oxide inducer layer 6 in the left-right direction is 62 nm, and the thickness of the gate-oxide inducer layer 6 in the up-down direction is 3 nm. The length of the first metal block 7 in the left-right direction is 28 nm, the thickness of the first metal block 7 in the up-down direction is 5 nm, the lengths of the second metal block 8 and the third metal block 9 in the left-right direction are 20 nm, and the thicknesses of the second metal block 8 and the third metal block 9 in the up-down direction are 5 nm.

According to the N-type FET in Embodiment 1 and the P-type FET in Embodiment 2, under the action of the second metal block 8, the third metal block 9 and the gate-oxide inducer layer 6, the channel region 4 is intrinsically doped, and the drain region 5 is N+-doped. In this case, a tunnel junction used for generating a tunneling current is formed at the joint interface of the channel region 4 and the drain region 5. Since the second metal block 8 and the third metal block 9 are spaced from each other and are not connected, no bias or passive device needs to be introduced. The first metal block 7 and the second metal block 8 are provided with insulation layers used as isolation materials, so the gate voltage accessed to the first metal block 7 is about half of a power supply voltage accessed to the N-type FET or the P-type FET, and a tunneling current irrelevant to the gate voltage may be generated at the joint interface of the channel region 4 and the drain region 5. Moreover, the distance of 10 nm between the second metal block 8 and the third metal block 9 provides a sufficient tunneling distance for the N-type FET or the P-type FET, such that the process limitation of the distance between the second metal block 8 and the third metal block 9 is overcome. Due to the fact that the source region 3 is made from metal rather than semiconductor materials, a Schottky barrier at a joint interface of the source region 3 and the channel region 4 can be modulated through the gate voltage, and a Schottky tunneling current can be generated at the joint interface of the source region 3 and the channel region 4. Since the length of the first metal block 7 in the left-right direction is greater than the length of the source region 3 in the left-right direction, a Schottky tunneling current greater than the tunneling current can be realized. The N-type FET in Embodiment 1 and the P-type FET in Embodiment 2 are opposite in polarity and identical in principle, and have good symmetry. When the gate voltage is equal to about half of the power supply voltage, the N-type FET and the P-type FET have the same current and equivalent resistance, and the current of the N-type FET matches the current of the P-type FET.

Figure 2:
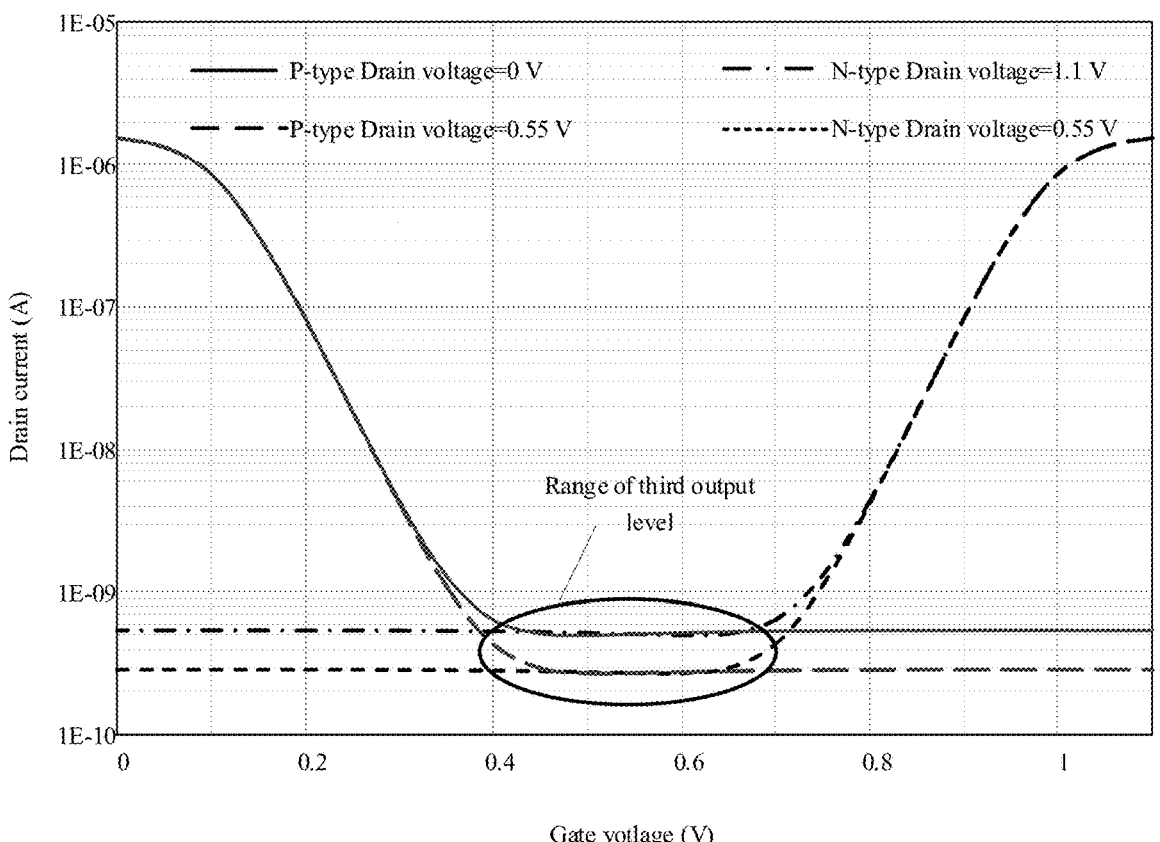
FIG. 2 is a simulation diagram of the current characteristic of a N-type device and a P-type device realized by the FET with a multi-value switching function according to the invention.

The ternary N-type FET and the ternary P-type FET of the invention are simulated in a Slivaco TCAD three-dimensional simulation environment, during the simulation process, the drain voltage of the N-type FET is fixed at 0.55 V and 1.1 V respectively, the drain voltage of the P-type FET is fixed at 0.55 V and 0 V respectively, a source of the N-type FET is connected to the ground being 0 V, a source of the P-type FET is connected to a power supply being 1.1 V, voltage scanning is performed on the first metal block 7 of the N-type FET and the P-type FET, and the scanning voltage is increased from 0 V to 1.1 V. The simulation diagram of the current characteristic of the N-type FET and the P-type FET is shown in FIG. 2, and it can be known, by analyzing FIG. 2, that the N-type FET and the P-type FET have symmetric transfer characteristic curves. When the drain voltage of the N-type FET and the P-type FET is equal to half of the power supply voltage (0.55 V), the drain current of the N-type FET is equal to the drain current the P-type FET, the current characteristic curve of the N-type FET and the current characteristic curve of the P-type FET overlap partially, and the equivalent resistance of the N-type FET is equal to the equivalent resistance of the P-type FET. The increase of the drain voltage of the N-type FET and the decrease of the drain voltage of the P-type FET have a smaller influence on the current of the overlapping portion. If the N-type FET and the P-type FET with the same equivalent resistance are used to equally divide the power supply voltage, a voltage of 0.55 V (a third output level) can be output.

Figure 3:
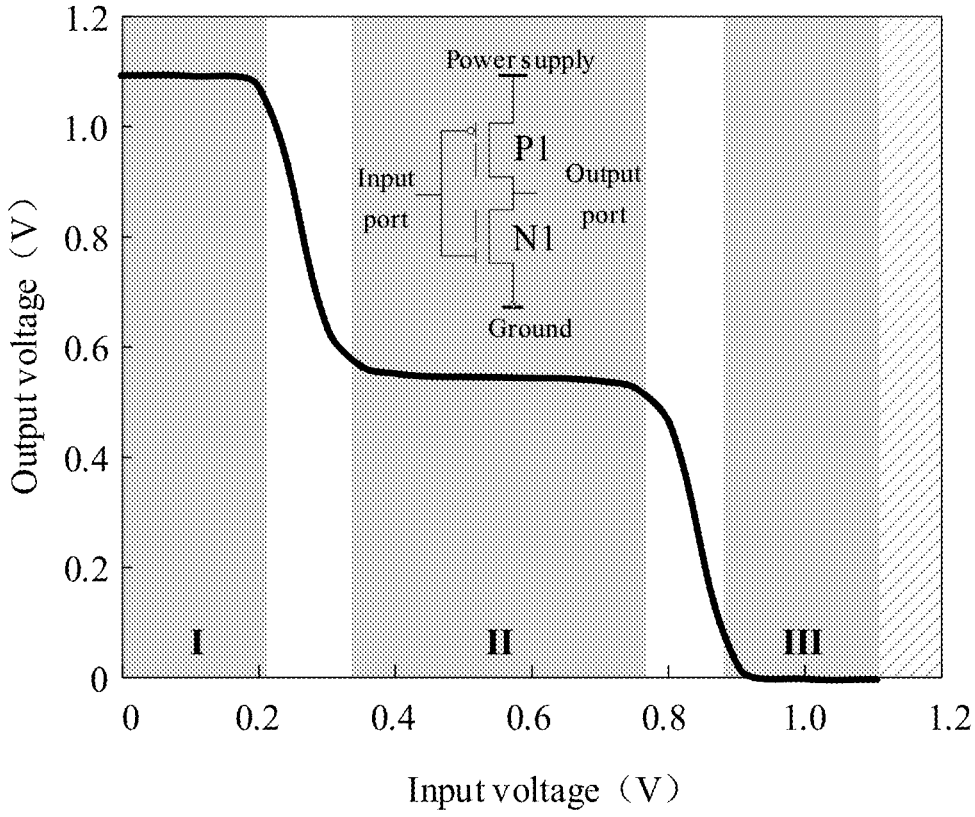
FIG. 3 is a diagram of the structure and voltage transfer characteristic of a ternary inverter realized by the FETs with a multi-value switching function according to the invention.

To verify the performance of the invention, the circuit structure of a ternary inverter based on the FETs with a multi-value switching function of the invention is obtained through a connection method of the N-type FET N1 and the P-type FET P1 shown in FIG. 3, wherein an input port of the ternary inverter is gate connecting terminals of the N-type FET N1 and the P-type FET P1, an output port of the ternary inverter is drains connecting terminal of the N-type FET N1 and the P-type FET P1, a power supply is accessed to a source of the P-type FET P1 to input a power supply voltage, and a source of the N-type FET N1 is connected to the ground. The black solid curve in FIG. 3 illustrates the voltage transfer characteristic of the ternary inverter. The voltage transfer characteristic of the ternary inverter is different from the voltage transfer characteristic of common binary inverters in that a stable intermediate level can be output when a voltage which is about half of the power supply voltage is input. The detailed operating principle is as follows. When the power supply voltage of the ternary inverter changes from 0 V to 0.35 V, the P-type FET P1 is completely turned on, and the N-type FET N1 is half turned on, as illustrated by area I in FIG. 3. The N-type FET N1 is in a high resistance state, the power supply voltage is accessed to the output port of the ternary inverter through the P-type FET P1, so the voltage output by the output port of the ternary inverter is 1.1 V. When the power supply voltage transits to area II which is about 0.5 VDD (VDD=1.1V), the N-type FET N1 and the P-type FET P1 are both half turned on due to the increase of the power supply voltage, the drain currents of the N-type FET N1 and the P-type FET P1 are predominant and match each other, the power supply voltage passes through a high-resistance path to form a voltage division network, and a stable intermediate level (0.55V) is output. If the supply voltage continues to increase to area III, the N-type FET N1 will be completely turned on, the ground wire is connected to the output port of the ternary inverter through the N-type FET N1, so the voltage output by the output port of the ternary inverter turns to 0 V. It thus can be seen that the ternary inverter realized by the FETs with a multi-value switching function provided by the invention can output three logic levels (0V, 0.55V and 1.1 V), and the output levels are stable.

What is claimed is:

1. A field effect transistor (FET) with a multi-value switching function comprising a main structure, a gate dielectric layer and a substrate layer, wherein the main structure comprises a source region, a channel region and a drain region which are distributed on the substrate layer from left to right and connected in sequence, the source region is made from NiAl alloy, the channel region is an undoped channel region and is made from an InAs material, the drain region is an undoped drain region and is made from an InAlAs material, and the gate dielectric layer is stacked on the source region and extends to the top of the channel region, wherein the FET further comprises:

a gate-oxide inducer layer stacked on the drain region and extends to the top of the channel region to be connected to the gate dielectric layer;

a metal layer comprising a first metal block, a second metal block and a third metal block which are arranged at intervals from left to right, wherein the first metal block is stacked on the gate dielectric layer, the second metal block is stacked on the gate-oxide inducer layer, and the third metal block is stacked on the gate-oxide inducer layer, and wherein the distance between the first metal block and the second metal block is 12 nm, and the distance between the second metal block and the third metal block is 10 nm; and a spacer layer, wherein the first metal block is a main control gate of the FET, the second metal block and the third metal block are used as two inducer gates of the FET, a gate voltage is accessed to the first metal block, the second metal block and the third metal block are used for generating a tunnel junction at a joint interface of the channel region and the drain region and are also used for realizing electrostatic doping of the channel region and the drain region under the induction of the gate-oxide inducer layer, such that the channel region and the drain region do not need to be chemically doped, and the spacer layer is used for isolating the first metal block from the second metal block and the third metal block to prevent the second metal block and the third metal block against interference from the gate voltage accessed to the first metal block.

2. The FET with the multi-value switching function according to claim 1, wherein:

when the FET is a N-type FET, a gate work function of the first metal block is 5.57 eV, a gate work function of the second metal block is 4.60 eV, a gate work function of the third metal block is 4.34 eV; and when the FET is a P-type FET, a gate work function of the first metal block is 4.47 eV, a gate work function of the second metal block is 4.40 eV, a gate work function of the third metal block is 5.90 eV.

3. The FET with the multi-value switching function according to claim 1, wherein the substrate layer is made from a sapphire material, the spacer layer is made from silicon nitride, the gate-oxide inducer layer is made from silicon dioxide, the gate dielectric layer is made from aluminum oxide, and the first metal block, the second metal block and the third metal block are made from polysilicon.

4. The FET with the multi-value switching function according to claim 1, wherein:

the source region, the channel region and the drain region are all rectangular structures, length directions of the source region, the channel region and the drain region are in left-right directions, width directions of the source region, the channel region and the drain region are front-back directions, thickness directions of the source region, the channel region and the drain region are up-down directions, front surfaces of the source region, the channel region and the drain region are located at the same plane, back surfaces of the source region, the channel region and the drain region are located at the same plane, upper surfaces of the source region, the channel region and the drain region are located at the same plane, lower surfaces of the source region, the channel region and the drain region are located at the same plane, a right surface of the source region is fixedly connected and attached to a left surface of the channel region, and a right surface of the channel region is fixedly connected and attached to a left surface of the drain region;

the substrate layer is a rectangular structure and is stacked below the source region, the channel region and the drain region, a front surface of the substrate layer is located in front of a plane where the front surface of the source region is located, a back surface of the substrate layer is located behind a plane where the back surface of the source region is located, a left surface of the substrate layer is located at the left of a plane where a left surface of the source region is located, a right surface of the substrate layer is located at the right of a plane where a right surface of the drain region is located, and an upper surface of the substrate layer is fixedly connected to the lower surfaces of the source region, the channel region and the drain region;

the gate dielectric layer is a rectangular structure, a left surface of the gate dielectric layer is located at the same plane as the left surface of the source region, a front surface of the gate dielectric layer is located at the same plane as the front surface of the source region, a back surface of the gate dielectric layer is located at the same plane as the back surface of the source region, a right surface of the gate dielectric layer is located between a plane where the left surface of the channel region is located and a plane where the right surface of the channel region is located, and a lower surface of the gate dielectric layer is fixedly connected to the upper surfaces of the source region and the channel region;

the gate-oxide inducer layer is a rectangular structure, a front surface of the gate-oxide inducer layer is located at the same plane as the front surface of the gate dielectric layer, a back surface of the gate-oxide inducer layer is located at the same plane as the back surface of the gate dielectric layer, an upper surface of the gate-oxide inducer layer is located at the same plane as the upper surface of the gate dielectric layer, a lower surface of the gate-oxide inducer layer is located at the same plane as the lower surface of the gate dielectric layer, a right surface of the gate-oxide inducer layer is located at the same plane as the right surface of the drain region, a lower surface of the gate-oxide inducer layer is fixedly connected to the upper surfaces of the drain region and the channel region, and a left surface of the gate-oxide inducer layer is fixedly connected and attached to the right surface of the gate dielectric layer; and the first metal block, the second metal block and the third metal block are all rectangular structures, a left surface of the first metal block is located at the same plane as the left surface of the gate dielectric layer, a right surface of the first metal block is located at the same plane as the right surface of the gate dielectric layer, a front surface of the first metal block is located at the same plane as the front surface of the gate dielectric layer, a back surface of the first metal block is located at the same plane as the back surface of the gate dielectric layer, a lower surface of the first metal block is fixedly connected to the upper surface of the gate dielectric layer, a front surface of the second metal block is located at the same plane as the front surface of the first metal block, a back surface of the second metal block is located at the same plane as the back surface of the first metal block, an upper surface of the second metal block is located at the same plane as the upper surface of the first metal block, a lower surface of the second metal block is located at the same plane as the lower surface of the first metal block and is fixedly connected to the upper surface of the gate-oxide inducer layer, a front surface of the third metal block is located at the same plane as the front surface of the first metal block, a back surface of the third metal block is located at the same plane as the back surface of the first metal block, an upper surface of the third metal block is located at the same plane as the upper surface of the first metal block, a lower surface of the third metal block is located at the same plane as the lower surface of the first metal block and is fixedly connected to the upper surface of the gate-oxide inducer layer, a left surface of the third metal block is located at the same plane as the left surface of the drain region, and a right surface of the third metal block is located at the same plane as the right surface of the drain region.

5. The FET with the multi-value switching function according to claim 4, wherein the spacer layer comprises a first spacer block, a second spacer block and a third spacer block which are formed integrally, wherein the second spacer block and the third spacer block are spaced from each other in the left-right direction, the second spacer block is located at the left of the third spacer block, the first spacer block is stacked on the second spacer block and the third spacer block, front surfaces of the first spacer block, the second spacer block and the third spacer block are located at the same plane, back surfaces of the first spacer block, the second spacer block and the third spacer block are located at the same plane, lower surfaces of the second spacer block and the third spacer block are located at the same plane, a left surface of the first spacer block is located at the left of a plane where a left surface of the second spacer block is located or is aligned with the left surface of the second spacer block in the up-down direction, a right surface of the first spacer block is located at the right of a plane where a right surface of the third spacer block is located or is aligned with the right surface of the third spacer block in the up-down direction, the second spacer block is embedded between the first metal block and the second metal block, the left surface of the second spacer block is attached to the right surface of the first metal block, a right surface of the second spacer block is attached to the left surface of the second metal block, a lower surface of the second spacer block is located at the same plane as the lower surface of the second metal block, an upper surface of the second spacer block is located at the same plane as the upper surface of the second metal block, a front surface of the second spacer block is located at the same plane as the front surface of the second metal block, a back surface of the second spacer block is located at the same plane as the back surface of the second metal block, the third spacer block is embedded between the second metal block and the third metal block, a left surface of the third spacer block is attached to the right surface of the second metal block, and the right surface of the third spacer block is attached to the left surface of the third metal block.

6. The FET with the multi-value switching function according to claim 5, wherein:
- the source region has a length of 20 nm and a width of 500 nm, the channel region has a length of 50 nm and a width of 500 nm, and the drain region has a length of 20 nm and a width of 500 nm;
- the length of the gate dielectric layer in the left-right direction is 28 nm, the thickness of the gate dielectric layer in the up-down direction is 3 nm, and the distance between a plane where the right surface of the gate dielectric layer is located and a plane where the left surface of the channel region is located is 8 nm;
- the length of the gate-oxide inducer layer in the left-right direction is 62 nm, and the thickness of the gate-oxide inducer layer in the up-down direction is 3 nm; and
- the length of the first metal block in the left-right direction is 28 nm, the thickness of the first metal block in the up-down direction is 5 nm, the lengths of the second metal block and the third metal block in the left-right direction are 20 nm, and the thicknesses of the second metal block and the third metal block in the up-down direction are 5 nm.

* * * * *